United States Patent [19]

Soliday

[11] Patent Number: 5,311,143
[45] Date of Patent: May 10, 1994

[54] RF AMPLIFIER BIAS CONTROL METHOD AND APPARATUS

[75] Inventor: John L. Soliday, Park Ridge, Ill.

[73] Assignee: Motorola, Inc., Schaumburg, Ill.

[21] Appl. No.: 908,144

[22] Filed: Jul. 2, 1992

[51] Int. Cl.$^5$ ............................................. H03G 3/20
[52] U.S. Cl. .................................... 330/127; 330/136
[58] Field of Search ............... 330/127, 129, 131, 136, 330/207 P; 455/127

[56] References Cited

U.S. PATENT DOCUMENTS

| | | | |
|---|---|---|---|
| 4,158,180 | 6/1979 | Challen | 330/207 P X |
| 4,547,746 | 10/1985 | Erickson et al. | 330/129 X |
| 4,760,347 | 7/1988 | Li et al. | 330/127 |
| 4,821,000 | 4/1989 | Imanishi | 330/207 P X |
| 5,043,672 | 8/1991 | Youn | 330/129 |
| 5,196,807 | 3/1993 | Fujisawa | 330/136 X |
| 5,204,637 | 4/1993 | Trinh | 330/129 |

Primary Examiner—Steven Mottola
Attorney, Agent, or Firm—Val Jean F. Hillman

[57] ABSTRACT

A bias control circuit (200) for use with an RF amplifier (202) comprises a detector (R1) coupled to the RF amplifier (202) for detecting a DC current provided to the amplifier (202) from supply voltage (VCC). Thereafter, an adjustment circuit (206-210), coupled to the detector (R1) and the RF amplifier (202) adjusts the amplifier's bias voltage (V bias) as a function of the current draw in order to control the RF amplifier's quiescent operating point (bias current) and thereby optimize the RF amplifier's operation for selected operating performance characteristics like gain performance, intermodulation performance, and efficiency.

9 Claims, 2 Drawing Sheets

RF AMPLIFIER BIAS CONTROL METHOD AND APPARATUS

FIELD OF THE INVENTION

The present invention relates generally to RF amplifiers and more particularly to RF power amplifiers.

BACKGROUND OF THE INVENTION

RF power amplifiers are used in a wide variety of communications and other electronic applications. These amplifiers are made up of one or more cascaded amplifier stages, each of which increases the level of the signal applied to the input of that stage by an amount known as the stage gain. Ideally, the input to output transfer of each stage is linear; a perfect replica of the input signal increased in amplitude appears at the amplifier output. In reality, however, all power amplifiers have a degree of non-linearity in their transfer characteristic. This non-linearity adversely effects various amplifier operating characteristics such as gain performance, intermodulation performance and efficiency.

Non-linear amplifier transfer characteristics gives rise to a phenomenon, hereinafter referred to as gain expansion. Gain expansion is caused by the change in the amplifier's base-emitter voltage due to rectification of input signal power in the base-emitter junction. In effect, the input signal power to an RF amplifier changes the amplifier's quiescent operating point. As a result, an RF amplifier's gain will increase as a function of the input signal power, thereby giving rise to the gain expansion phenomenon. Gain expansion is typically an undesirable characteristic exhibited by RF power amplifiers. This is especially true when the amplifier must operate across a wide dynamic range of input signals, like the multi-tone linear power amplifiers disclosed in patent application Ser. No. 07/855,172, filed Mar. 20, 1992, entitled HIGH DYNAMIC RANGE MODULATION INDEPENDENT FEED FORWARD AMPLIFIER NETWORK and assigned to the assignee of the present application. In such multi-tone applications, constant amplifier gain over a wide dynamic range of input signals is required.

This same non-linearity causes distortion of the amplifier's output signal so that it is no longer a perfect replica of the input signal. This distortion produces spurious signal components known as intermodulation products. Intermodulation products are typically undesirable because they cause interference, cross talk, and other deleterious effects on the performance of a system employing the amplifier. Of note, the quantity of intermodulation products generated by the amplifier is directly proportional to the magnitude of the signal applied to the amplifier's input.

Yet another RF power amplifier operating characteristic hampered by non-linear transfers is the amplifier's efficiency. By definition, an amplifier's efficiency is determined by POUT/PIN. The more efficient an amplifier is, the less input power required to achieve a desirable output level. Since gain expansion tends to distort the amplifier's output power level, it has the undesirable effect of decreasing an amplifier's efficiency at low output powers.

Accordingly, the prior art reflects various methods and devices designed to improve one or more of the amplifier's operating characteristics, typically at the expense of others. As will be appreciated, optimizing for any one parameter adversely effects the others, since they are all closely interrelated. Thus, while biasing the amplifier's quiescent operating point low tends to improve the amplifier's efficiency, intermodulation performance and saturation point, it nonetheless compromises the maximum gain available and the amplifier's gain flatness (constant gain over wide dynamic range). Conversely, while biasing the amplifier's quiescent operating point higher tends to improve the maximum gain available and the amplifier's gain flatness, it nonetheless compromises the amplifier's efficiency, intermodulation performance and saturation point.

It would be extremely advantageous therefore to provide a compensation circuit capable of equalizing an RF power amplifier's operating characteristics over a wide dynamic range of inputs, while avoiding the shortcomings of the prior art.

SUMMARY OF THE INVENTION

Briefly described, the present invention is a method and apparatus for controlling the bias current of an RF amplifier comprising apparatus and method steps of detecting a DC current drawn by the RF amplifier and adjusting the RF amplifier's bias current as a function of the detected DC current in order to control the RF amplifier's quiescent operating point and thereby optimize the amplifier's operation for performance characteristics like gain expansion, intermodulation performance and efficiency.

DETAILED DESCRIPTION OF THE PREFERRED EMBODIMENT

Figure 1:
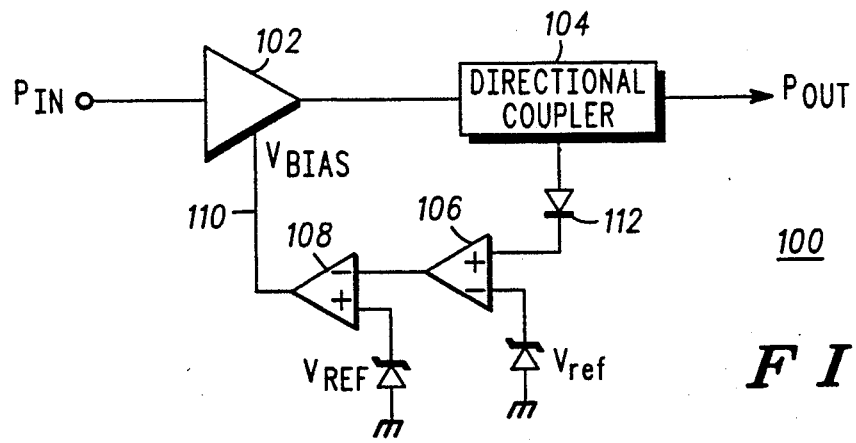
FIG. 1 shows a first embodiment of an RF amplifier bias control circuit in accordance with the present invention.
Figure 5:
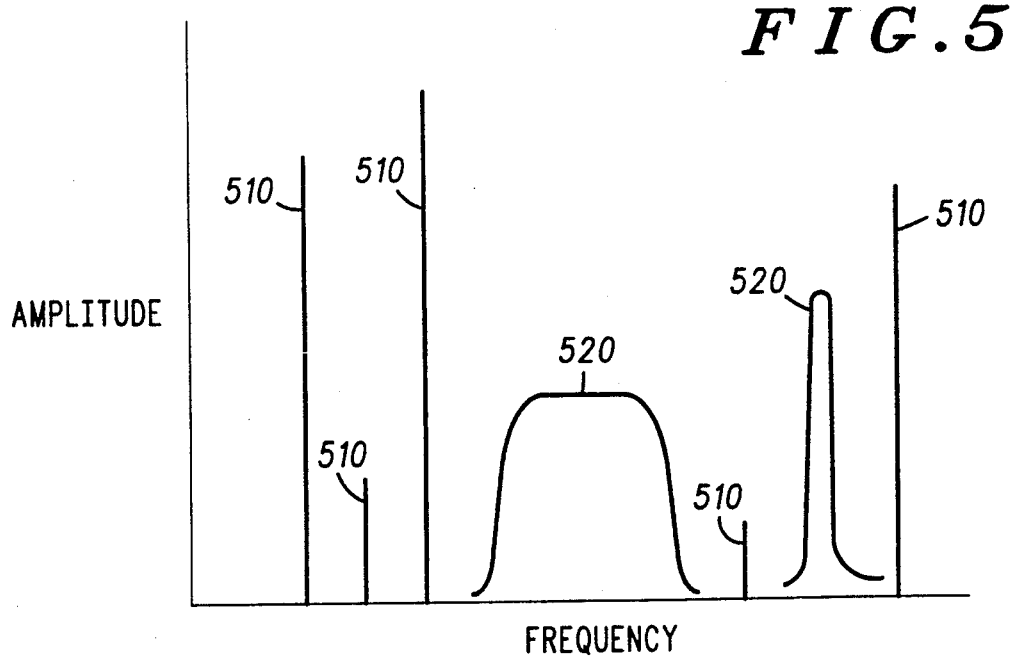
FIG. 5 depicts an exemplary signalling environment anticipated by the amplifier networks of FIGS. 1-3.

Referring to FIG. 1, there is shown in block diagram form, an RF amplifier network 100 according to the present invention. An exemplary signalling environment for this network is depicted in FIG. 5. As shown in FIG. 5, network 100 signalling anticipates both narrow bandwidth modulated input signals 510 and wide bandwidth modulated input signals 520, such as, for example, a Frequency Division Multiple Access (FDMA) format and/or a Code Division Multiple Access (CDMA) format. In addition to comprising multiple modulation formats, the proposed signalling environment of the RF amplifier network 100 is further characterized by input signals which exhibit a wide dynamic range of input power levels.

Figure 2:
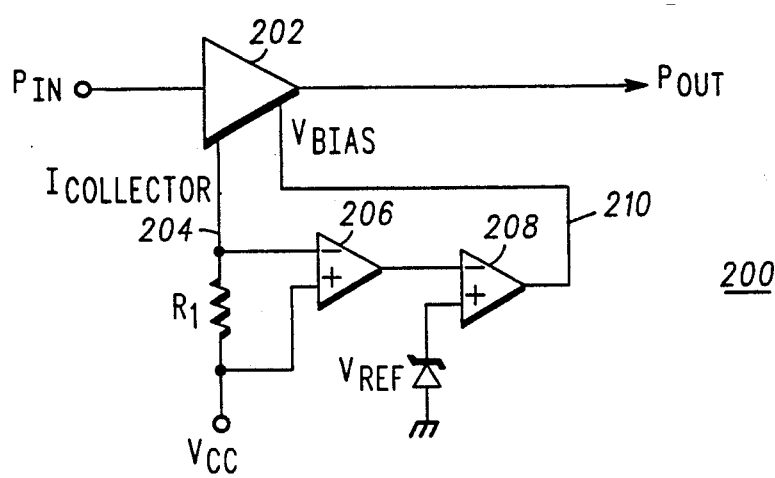
FIG. 2 shows a second embodiment of an RF amplifier bias control circuit in accordance with the present invention.
Figure 4:
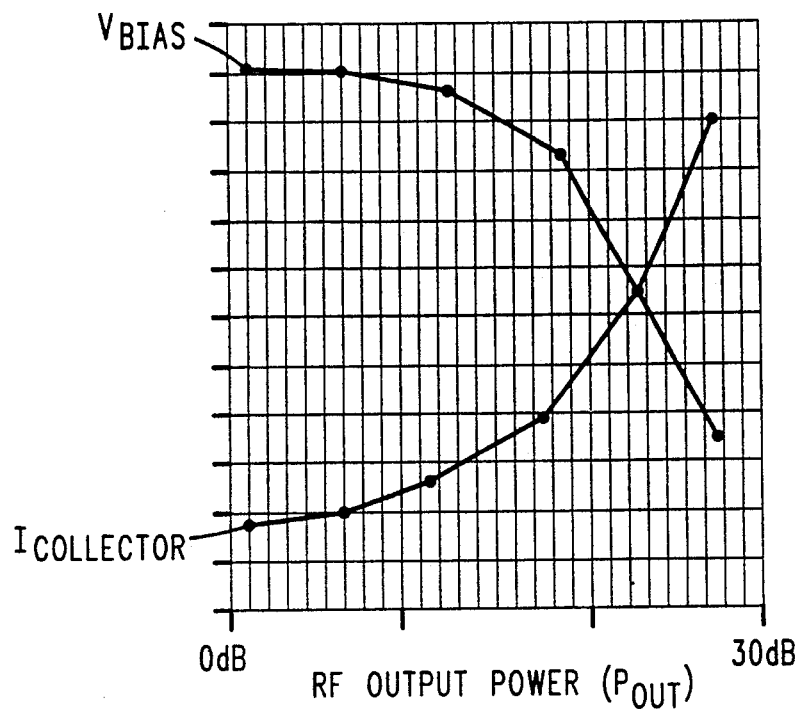
FIG. 4 depicts the transfer function of the bias control circuits in accordance with FIGS. 1, 2 and 3.

Referring back to FIG. 1, the RF amplifier network 100 includes an RF amplifier 102, directional coupler 104, DC amplifier 106, DC inverting amplifier 108 and diode detector 112. During operation, the RF input signal PIN is amplified by the RF amplifier 102 in order to provide an amplified output signal POUT. A portion of the amplified output signal is routed to the DC amplifier 106 via directional coupler 104 and diode detector 112 which converts the RF output power level POUT to a DC voltage. The DC amplifier 106 compares the converted DC signal to a reference Vref and amplifies the difference. This amplified difference signal is then routed to DC inverting amplifier 108 which is configured so as to provide a decreasing bias voltage Vbias to the RF amplifier 102 as the amplifier output power level POUT increases, thereby adjusting the amplifier bias current as a function of the output power level, in order to control the amplifier's quiescent operating point. The Zenor diode VREF acts as a reference for this inversion. As will be appreciated, VREF may be tailored so as to adjust the slope of the dynamic bias transfer curve injected into the RF amplifier 102 along path 110, as shown in FIG. 4. Referring to FIG. 2, there is shown in block diagram form, a second embodiment of an RF amplifier network 200 according to the present invention. The RF amplifier network 200 includes an RF amplifier 202, resistor R1, DC amplifier 206, Zenor diode VREF, and DC inverting amplifier 208. During operation, the output power POUT of the RF amplifier 202 is detected as a function of the collector current, I Collector, injected into the RF amplifier 202 along path 204. As will be appreciated, the collector current is directly proportional to the output power of an RF amplifier 202. In this effort, the resistor R1, in circuit with supply voltage Vcc is employed as an I Collector current sensor.

In accordance with the preferred embodiment, R1 is a very low impedance resistor, typically 0.05 -1 ohm in value. This impedance tends to produce a voltage drop across R1, that while detectable, is small enough to avoid degradation of the overall amplifier performance. In accordance, the voltage drop is amplified by the DC operational amplifier 206 and routed to DC inverting amplifier 208.

Inverting amplifier 208 is so configured in order to provide a decreasing bias voltage Vbias to the RF amplifier 202 as the output power POUT increases, thereby adjusting the amplifier bias current as a function of the output power level, in order to control the amplifier's quiescent operating point. The Zenor diode VREF acts as a reference for this inversion. As will be appreciated, VREF may be tailored so as to adjust the slope of the dynamic bias transfer curve injected into the RF amplifier 202 along path 210.

Figure 3:
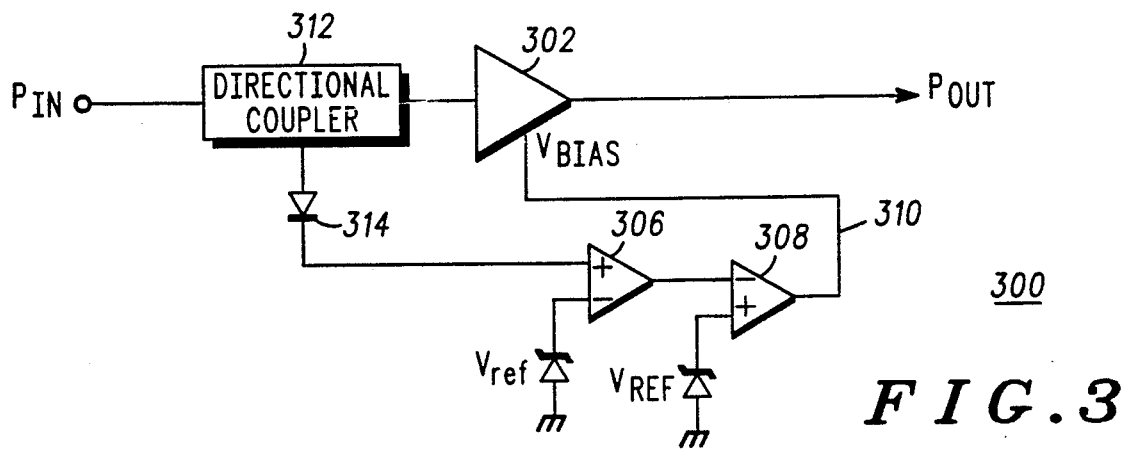
FIG. 3 shows yet a third embodiment of an RF amplifier bias control circuit in accordance with the present invention.

Referring to FIG. 3, there is shown yet another embodiment of an RF amplifier network 300 according to the present invention. The RF amplifier network 300 operates substantially in accordance with the description provided with FIG. 1, except that the RF amplifier bias current is adjusted as a function of the RF input signal power level, PIN, as opposed to the RF output signal power level, POUT. A directional coupler 312 routes the RF input signal PIN to the bias control circuit 306–310 which operates to provide a decreasing bias voltage, Vbias, to the RF amplifier 302 as the amplifier input power level PIN increases, thereby adjusting the amplifier bias current as a function of the input power level, in order to control the amplifier's quiescent operating point.

It will be appreciated by those skilled in the art that FIG. 4 depicts the transfer function of the bias control circuits of FIGS. 1, 2 and 3.

In summary, the overall effect of the various bias control circuits described herein are to increase the bias voltage to an RF amplifier during low output power levels, while decreasing the bias voltage of the RF amplifier during high output power levels in order to overcome the phenomenon of gain expansion and to optimize the amplifier's operation for selected operating performance characteristics like intermodulation performance an efficiency.

What is claimed is:

1. A bias control circuit for use with an RF amplifier having an input, an output, a supply voltage and a plurality of operating performance characteristics responsive to a quiescent operating point established by the RF amplifier bias current, said circuit comprising:
    means, coupled to the RF amplifier, for detecting a DC current drawn by the RF amplifier from the supply voltage; and
    means, coupled to the detecting means, and the RF amplifier, for adjusting the RF amplifier bias current as a function of the detected DC current, to control the RF amplifier's quiescent operating point and thereby optimize the RF amplifier's operation for selected operating performance characteristics.

2. The circuit of claim 1 wherein the detecting means comprises a DC current detector.

3. The circuit of claim 1 wherein the detecting means comprises a series resistor connected to the supply voltage.

4. The circuit of claim 1 wherein the adjusting means comprises a DC amplifier.

5. The circuit of claim 1 wherein the RF amplifier's operating performance characteristics comprise at least one of:
    gain performance;
    intermodulation performance; and
    efficiency.

6. In an RF amplifier having an input, an output, a supply voltage and a plurality of operating performance characteristics, responsive to a quiescent operating point established by the RF amplifier's bias current, a method for controlling said bias current comprising the steps of:
    detecting a DC current level drawn by the RF amplifier by the supply voltage; and
    adjusting the RF amplifier bias current as a function of the detected DC current, to control the RF amplifier's quiescent operating point.

7. The method of claim 6 wherein the RF amplifier's bias current is adjusted in order to simultaneously optimize the amplifier's gain performance, intermodulation performance and efficiency.

8. The method of claim 6 wherein the step of adjusting the RF amplifier bias current further comprises the steps of:
    decreasing a bias voltage to the RF amplifier when the detected DC current level increases; and
    increasing the bias voltage to the RF amplifier when the detected DC current level decreases.

9. A bias control circuit for use with an RF amplifier having an input, an output, a supply voltage and a plurality of operating performance characteristics responsive to a quiescent operating point established by the RF amplifier bias current, said circuit comprising:
    a detector coupled to the RF amplifier, for detecting a DC current drawn by said amplifier by the supply voltage and including a resistor coupled between the supply voltage and the RF amplifier, and a differential amplifier having first and second inputs coupled to terminals of said resistor to sense said current and provide an output signal; and
    means, responsive to the output signal for varying the RF amplifier bias current.

* * * * *

UNITED STATES PATENT AND TRADEMARK OFFICE
CERTIFICATE OF CORRECTION

PATENT NO. : 5,311,143

DATED : May 10, 1994

INVENTOR(S) : John L. Soliday

It is certified that error appears in the above-identified patent and that said Letters Patent is hereby corrected as shown below:

Col. 4, line 60, "drawn by" should be --provided to--.

Signed and Sealed this

Twenty-eight Day of March, 1995

Attest:

BRUCE LEHMAN

Attesting Officer

Commissioner of Patents and Trademarks